US012722251B2

(12) United States Patent
Lee et al.

(10) Patent No.: US 12,722,251 B2
(45) Date of Patent: Sep. 1, 2026

(54) SLURRY SUPPLY DEVICE, SUBSTRATE POLISHING APPARATUS, AND SUBSTRATE POLISHING METHOD

(71) Applicant: SAMSUNG ELECTRONICS CO., LTD., Suwon-si (KR)

(72) Inventors: Seungchul Lee, Hwaseong-si (KR); Dongil Kim, Hwaseong-si (KR); Hyunjoon Park, Suwon-si (KR); Kiju Sohn, Gunpo-si (KR); Jonghun Pi, Gyeongsangbuk-do (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 1099 days.

(21) Appl. No.: 17/704,676

(22) Filed: Mar. 25, 2022

(65) Prior Publication Data

US 2023/0096455 A1 Mar. 30, 2023

(30) Foreign Application Priority Data

Sep. 29, 2021 (KR) ........................ 10-2021-0129053

(51) Int. Cl.
*B24B 57/02* (2006.01)
*H10P 52/40* (2026.01)

(52) U.S. Cl.
CPC ............ *B24B 57/02* (2013.01); *H10P 52/402* (2026.01)

(58) Field of Classification Search
None
See application file for complete search history.

(56) References Cited

U.S. PATENT DOCUMENTS 6,910,954 B2 6/2005 Kim et al.
8,197,306 B2 6/2012 Borucki et al.
10,170,345 B2 1/2019 Shinozaki et al.
2020/0269385 A1 8/2020 Kobata et al.

FOREIGN PATENT DOCUMENTS

JP 5542818 B2 7/2014
JP 2021-146498 A 9/2021
JP 7492854 * 5/2024 ............ B24B 37/10
KR 10-2007-0039644 A 4/2007
KR 10-1394745 B1 5/2014
KR 10-1584943 B1 1/2016
KR 10-1637537 B1 7/2016
KR 20190058942 A * 5/2019 ............ B24B 57/02

* cited by examiner

*Primary Examiner* — Brian D Keller
*Assistant Examiner* — Jason Khalil Hawkins
(74) *Attorney, Agent, or Firm* — Fish & Richardson P.C.

(57) ABSTRACT

A slurry supply device includes; a slurry distribution part configured to dispense slurry, and a support part connected to the slurry distribution part and configured to support the slurry distribution part. The slurry distribution part includes; a guide bar including a slot extending in a first direction, a distribution bar inserted into the slot and including a distribution channel extending in the first direction, the distribution channel being recessed upwardly from a bottom surface of the distribution bar, and a slurry delivery member configured to deliver slurry to the distribution channel.

17 Claims, 12 Drawing Sheets

PPU

PP

PN

D1

D2

D3

SLURRY SUPPLY DEVICE, SUBSTRATE POLISHING APPARATUS, AND SUBSTRATE POLISHING METHOD

CROSS-REFERENCE TO RELATED APPLICATION

This U.S. nonprovisional application claims priority under 35 U.S.C § 119 to Korean Patent Application No. 10-2021-0129053 filed on Sep. 29, 2021 in the Korean Intellectual Property Office, the subject matter of which is hereby incorporated by reference in its entirety.

BACKGROUND

The inventive concept relates to slurry supply devices, substrate polishing apparatuses, and substrate polishing methods. More particularly, the inventive concept relates to slurry supply devices providing improved slurry distribution, substrate polishing apparatuses including same, and substrate polishing methods using same.

Various processes must be performed to successfully fabricate a semiconductor device. Such processes generally include, for example, photolithography processes, etching processes, deposition processes, and the like. At times the surface of a semiconductor device, or the surface of a wafer upon which the semiconductor device is being fabricated, must be planarized before succeeding process(es) may be performed. In this regard, a polishing process may be performed to planarize the surface of the wafer. Polishing processes may vary by particular application. For example, chemical mechanical polishing (CMP) may be used to planarize the wafer or material layer(s) disposed on the wafer.

SUMMARY

Embodiments of the inventive concept provide slurry supply devices capable of supplying slurry to a polishing pad. Other embodiments of the inventive concept provide substrate polishing apparatuses including same, and still other embodiments of the inventive concept provide substrate polishing methods using same.

For example in various aspects, embodiments of the inventive concept may variously provide a slurry supply device capable of better dispersing slurry on polishing pad(s), reducing slurry consumption to reduce cost, and/or better controlling a slurry supply (or application) area. Other embodiments of the inventive concept may provide substrate polishing apparatuses including same, and still other embodiments of the inventive concept may provide substrate polishing methods using same.

However, aspects, objects and features of the inventive concept are not limited to only those expressed recited above. Rather, those skilled in the art will recognize alternate and/or additional aspects, objects and features, as well as the making and use of the inventive concept upon consideration of the following detailed description.

According to some embodiments of the inventive concept, a slurry supply device may include; a slurry distribution part configured to dispense slurry, and a support part connected to the slurry distribution part and configured to support the slurry distribution part. The slurry distribution part may include; a guide bar including a slot extending in a first direction, a distribution bar inserted into the slot and including a distribution channel extending in the first direction, the distribution channel being recessed upwardly from a bottom surface of the distribution bar, and a slurry delivery member configured to deliver slurry to the distribution channel.

According to some embodiments of the inventive concept, a substrate polishing apparatus may include; a platen configured to support a polishing pad, a polishing head on the platen, and a slurry supply device separated from the polishing head. The slurry supply device may include; a slurry distribution part configured to dispense slurry and including a distribution bar extending in a first direction and including a distribution channel recessed upwardly from a bottom surface of the distribution bar and a slurry delivery member configured to delivers slurry to the distribution bar, and a support part connected to the slurry distribution part and configured to support the slurry distribution part. A width of the distribution channel in a second direction may be is less than a width of the bottom surface of the distribution bar in the second direction intersecting the first direction.

According to some embodiments of the inventive concept, a substrate polishing method may include; rotating a polishing pad, placing a substrate on the polishing pad;

contacting the substrate with the polishing pad, and supplying the polishing pad with slurry using a slurry distribution part of a slurry supply device to dispense the slurry onto a surface of the polishing pad. The slurry distribution part may include a distribution bar including a distribution channel extending in a first direction, and a slurry delivery member configured to delivers the slurry to the distribution bar. The distribution channel may be recessed upwardly from a bottom surface of the distribution bar, and the bottom surface of the distribution bar may face the top surface of the polishing pad.

BRIEF DESCRIPTION OF THE DRAWINGS

Various embodiments of the inventive concept are illustrated in the accompanying drawings, in which:

FIG. 6 is an enlarged bottom-up view of region 'X' indicated in FIG. 5;

FIG. 8 is a cross-sectional view taken along line II-II' of FIG. 4;

FIGS. 10, 11 and 12 are various diagrams further illustrating a substrate polishing method in accordance with the substrate polishing method of FIG. 9.

DETAILED DESCRIPTION

Throughout the written description and drawings, like reference numbers and labels are used to denote like or similar elements, components, method steps and/or features. Throughout the written description certain geometric terms may be used to highlight relative relationships between elements, components and/or features with respect to certain embodiments of the inventive concept. Those skilled in the art will recognize that such geometric terms are relative in nature, arbitrary in descriptive relationship(s) and/or directed to aspect(s) of the illustrated embodiments. Geometric terms may include, for example: height/width; vertical/horizontal; top/bottom; higher/lower; closer/farther; thicker/thinner; proximate/distant; above/below; under/over; upper/lower; center/side; surrounding; overlay/underlay; etc.

Figure 1:
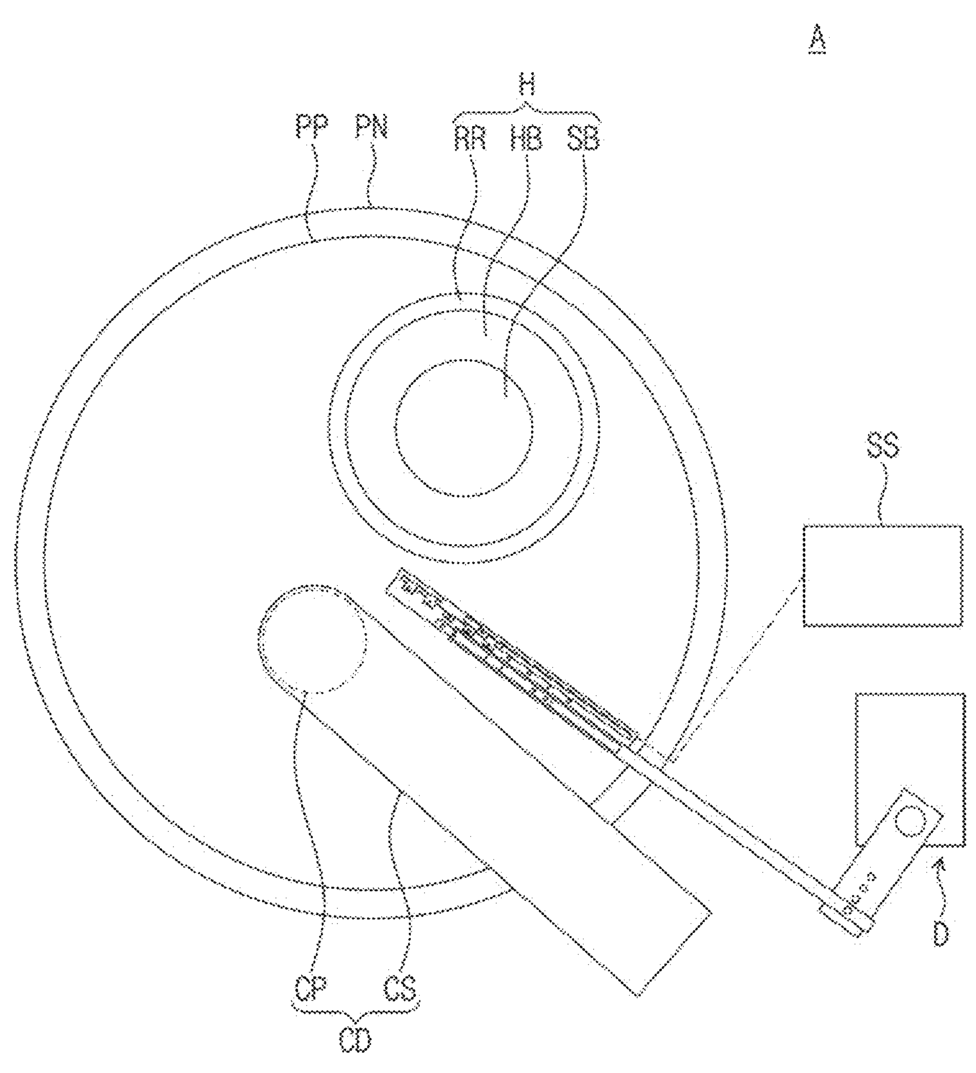
FIG. 1 is a plan (or top-down) view illustrating a substrate polishing apparatus according to embodiments of the inventive concept.

FIG. 1 is a plan view illustrating a substrate polishing apparatus 'A' according to embodiments of the inventive concept.

Referring to FIG. 1, the substrate polishing apparatus 'A' may be configured to polish a surface of a substrate. The substrate may include a silicon wafer, but the inventive concept is not limited thereto. The substrate polishing apparatus 'A' may polish the substrate by controlling contact between the substrate and a top surface of a polishing pad 'PP' as the substrate is rotated. In some embodiments, the substrate polishing apparatus 'A' may be a chemical mechanical polishing (CMP) apparatus. The substrate polishing apparatus 'A' may generally include, for example: a platen 'PN', a polishing head 'H', a conditioning device 'CD', a slurry supply device 'D', and a slurry tank 'SS'.

The platen 'PN' may be used to support the polishing pad 'PP', such that the polishing pad 'PP' polishes the substrate by contacting a surface of the substrate. In some embodiments, both the platen 'PN' and the polishing pad 'PP' may have a circular plate shape, wherein the polishing pad 'PP' is disposed on a top surface of the platen 'PN' and the platen 'PN' rotates the polishing pad 'PP' to polish the substrate. That is, rotation of the platen 'PN' may induce rotation of the polishing pad 'PP' contacting the surface of the substrate.

The polishing head 'H' may be disposed on the polishing pad 'PP' to positionally support the substrate. That is, the polishing head 'H' may serve to position the substrate on the polishing pad 'PP', such that the surface of the substrate being polished faces the polishing pad 'PP'.

In some embodiments, the polishing head 'H' may include a head supporter 'SB', a head body 'HB', and a retainer ring 'RR'. Here, the head supporter 'SB' may support the head body 'HB', as the head body 'HB' supports the substrate. For example, the head body 'HB' may use vacuum pressure to adhere the substrate to a bottom surface of the head body 'HB'. Hence, in some embodiments, the head body 'HB' may be connected to a vacuum pump (not shown in FIG. 1). Once the substrate is adhered to the bottom surface of the head body 'HB', the retainer ring 'RR' may substantially surround the circumference of the substrate. One example of this configuration is describe din some additional detail hereafter.

The conditioning device 'CD' may be used to refurbish (or condition) the polishing pad 'PP'. The refurbishing of the conditioning device 'CD' may continually condition (or retexture) a top surface of the polishing pad 'PP' during the substrate polishing process. In some embodiments, the conditioning device 'CD' may include a conditioning disk 'CP' and a disk supporter 'CS". Thus, the conditioning disk 'CP' is disposed on the polishing pad 'PP and refurbishes the top surface of the polishing pad 'PP' as it rotates over the substrate. In some embodiments, the conditioning disk 'CP' may have a circular plate shape.

The disk supporter 'CS" may be used to positionally support the conditioning disk 'CP'. In some embodiments, the disk supporter 'CS" may include a cantilever structure extending laterally over the platen 'PN'. In this manner, the disk supporter 'CS" may selectively position (or drive) the conditioning disk 'CP' in relation to the polishing pad 'PP'.

The slurry supply device 'D' may be used to supply the polishing pad 'PP' with slurry. In this regard, the slurry supply device 'D' may receive slurry from the slurry tank 'SS', and dispense the received slurry onto the polishing pad 'PP'. In this regard, the slurry supply device 'D' may physically separate from the polishing head 'H'. In some embodiments, the slurry supply device 'D' may be disposed between the conditioning device 'CD' and the polishing head 'H'. For example, in relation to a rotational direction of the platen 'PN', the slurry supply device 'D' may be disposed between the conditioning device 'CD' and the polishing head 'H' and may provide slurry to the slurry supply device D from this disposition. That is, assuming a counter-clockwise rotational direction for the platen 'PN' in the illustrated example of FIG. 1, the slurry supply device 'D' may be disposed between a back side (or edge) of the conditioning device 'CD' and a front side (or edge) of the polishing head 'H.' One example of this configuration will be described hereafter in some additional detail.

The slurry tank 'SS' may be used to store and provide slurry to the slurry supply device 'D', such that the slurry supply device 'D' may continually dispense (e.g., spray) slurry onto the surface of the polishing pad 'PP'.

Figure 2:
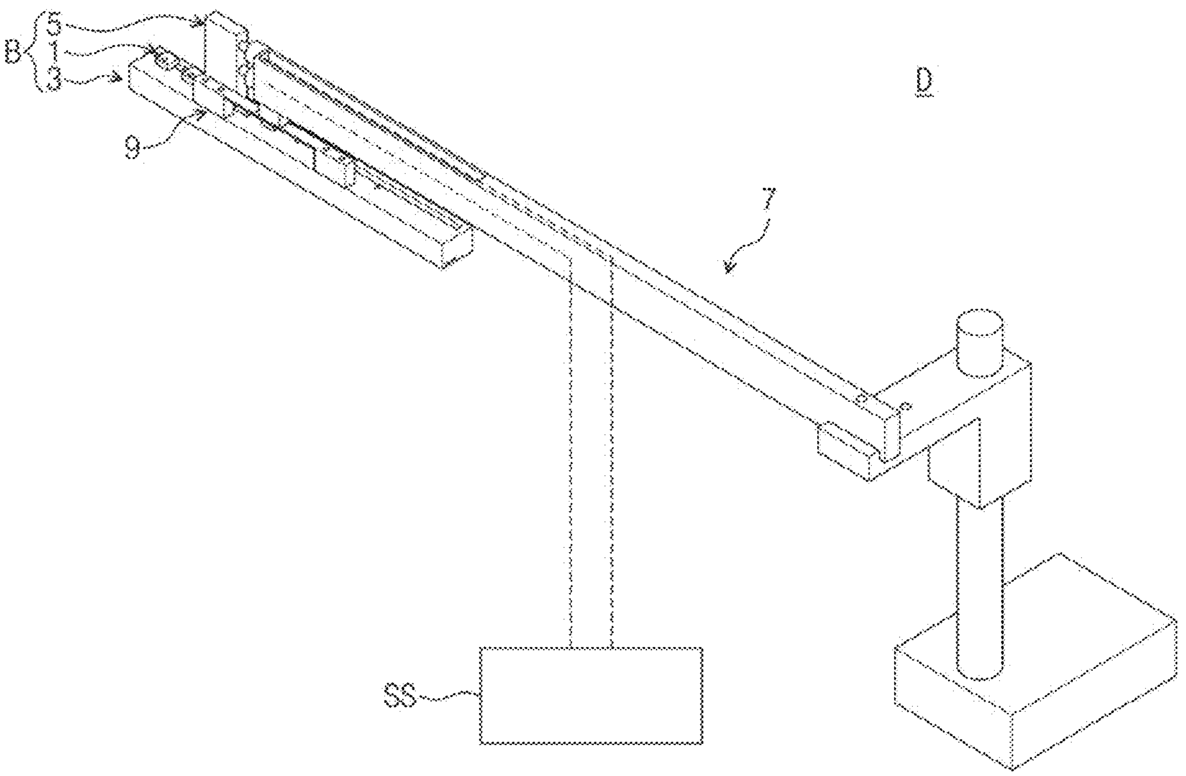
FIG. 2 is a perspective view.
Figure 3:
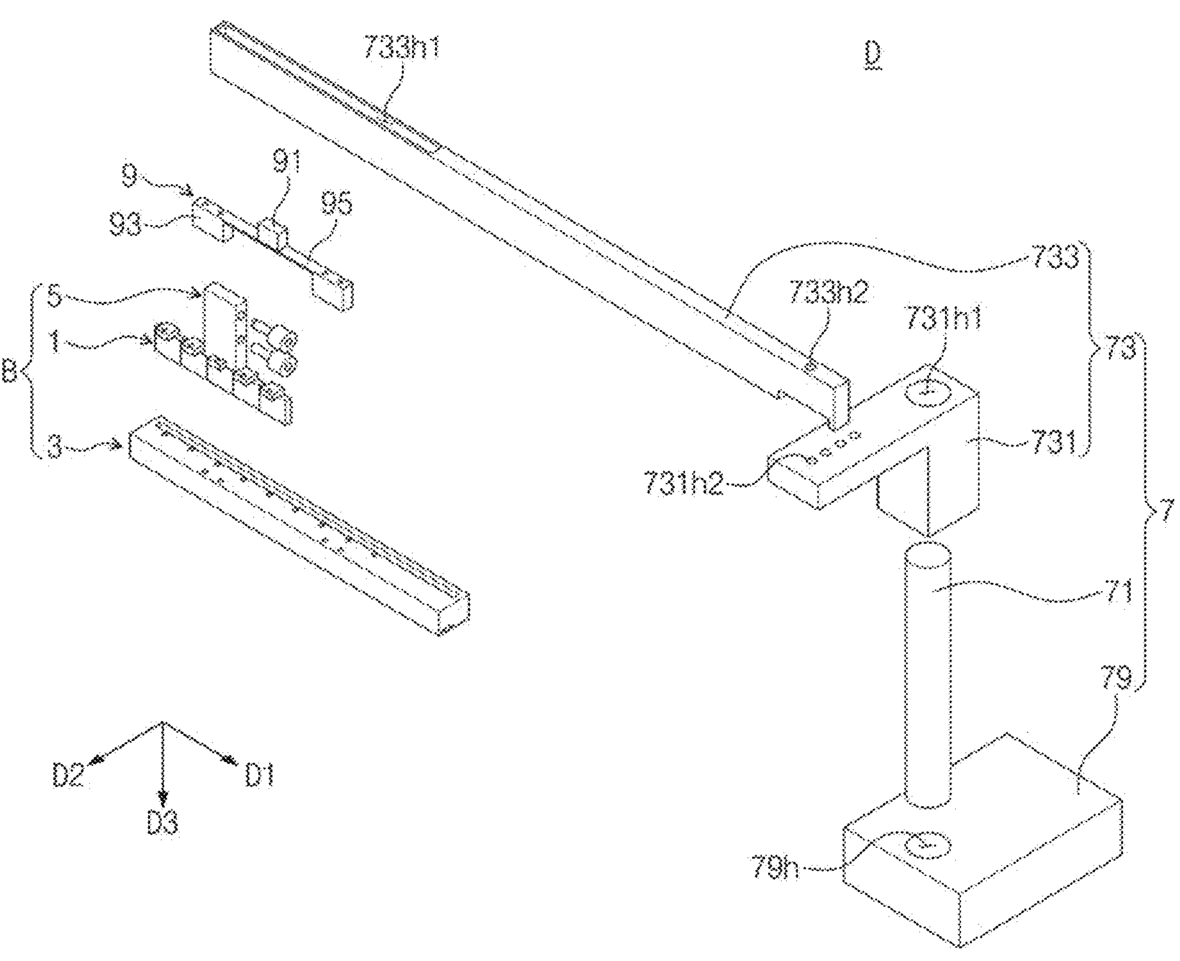
FIG. 3 is an exploded perspective view further illustrating the slurry supply device 'D' of FIG. 1.

FIG. 2 is a perspective view and FIG. 3 is an exploded perspective view further illustrating in one embodiment the slurry supply device 'D' of FIG. 1.

As illustrated in FIG. 3, the illustrated embodiment of FIGS. 2 and 3 will be described in relation to a geometric space defined in three (3) directions—a first (horizontal) direction D1, a second (horizontal) direction D2 intersecting the first direction D1, and a third (vertical) direction D3 substantially orthogonal to the first and second directions D1 and D2. Here, opposing extensions of the third direction D3 may be referred to as downward (as shown in FIG. 3) or upward.

Referring to FIGS. 1, 2 and 3, the slurry supply device 'D' may generally include a slurry distribution part 'B', a support part 7, and a connection part 9.

Here, the slurry distribution part 'B' may be configured to dispense (or spray) slurry onto the polishing pad 'PP'. Accordingly, the slurry distribution part 'B' may be connected to the slurry tank 'SS' in manner which effectively transfers slurry from the slurry tank 'SS" to the slurry distribution part 'B'. Thereafter, the slurry distribution part 'B' may spray slurry onto the surface of the polishing pad 'PP'.

In some embodiments, the slurry distribution part 'B' may include a distribution bar 1, a guide bar 3, and a slurry delivery member 5. Here, the distribution bar 1 laterally extends in the first direction D1 and is connected to the slurry delivery member 5, such that slurry delivered by the slurry delivery member 5, is sprayed in the first direction D1 back along the distribution bar 1. The guide bar 3 also extends in the first direction D1, such that a length of the guide bar 3 in the first direction D1 is greater than a length of the distribution bar 1 in the first direction D1. In this regard, the guide bar 3 may be variously connected (or combined) with the distribution bar 1. For example, at least a portion of the distribution bar 1 may be inserted into the guide bar 3.

The slurry delivery member 5 may deliver (or transfer) slurry to the distribution bar 1. For example, the slurry supplied from the slurry tank 'SS' may transfer through the slurry delivery member 5 to the distribution bar 1. The slurry delivery member 5 may be connected (or combined) with the distribution bar 1. For example, as shown in FIGS. 2 and 3, the slurry delivery member 5 may be coupled to an upper side of the distribution bar 1. The inventive concept, however, are not limited thereto, and the slurry delivery member 5 may be coupled to a lateral surface of the distribution bar 1.

Certain embodiments of the slurry distribution part 'B' are described hereafter in relation to FIGS. 4, 5, 6, 7 and 8.

Referring to FIGS. 1, 2 and 3, the support part 7 may be connected to the slurry distribution part 'B' in a manner that allows the support part 7 to laterally support (e.g., in the first direction D1) the slurry distribution part 'B'. For example, the support part 7 may be directly or indirectly connected to the slurry distribution part B to support the slurry distribution part B. In some embodiments, the support part 7 may have a cantilever structure.

Referring to FIG. 3, in some embodiments, the support part 7 may include a base 79, a rotation support shaft 71, and a rotation member 73. Here, the base 79 may vertically support the rotation support shaft 71. This may be accomplished by inserting the base 79 into a downwardly-extending, shaft insertion hole **79*h*. That is, the shaft insertion hole 79*h* may be an aperture downwardly recessed into a top surface of the base 79 and configured to receive the rotation support shaft 71**.

Hence, the vertically-extending (e.g., in the third direction D3), rotation support shaft 71 may be mechanically combined with the base 79 through the insertion of the rotation support shaft 71 into the shaft insertion hole **79*h* in order to support the rotation support shaft 71. For example, the rotation member 73 may be supported and connected to the rotation support shaft 71, such that it laterally extends (e.g., in the first direction D1) over the platen 'PN". Thus, the rotation member 73 may be rotatable around the rotation support shaft 71**.

In some embodiments, the rotation member 73 may include a first rotation member 731 and a second rotation member 733. The first rotation member 731 may be connected (or combined) with the rotation support shaft 71 using, for example, a rotation insertion hole **731*h*1. That is, an upper end of the rotation support shaft 71 may be inserted into the rotation insertion hole 731*h*1, so that the first rotation member 731 may be rotationally coupled to the rotation support shaft 71. The first rotation member 731 may further provide at least one first position adjustment hole 731*h*2**.

The second rotation member 733 may be connected (or combined) with the first rotation member 731 using, for example, at least one coupling hole **733*h*2 and an insertion slot 733*h*1. That is, the second rotation member 733 may be connected to the first rotation member 731 in such a manner that the coupling hole 733*h*2 overlaps one of the at least one first position adjustment hole 731*h*2. In this regard, a connecting part (not shown) such as a bolt or a screw, may be inserted into the at least one coupling hole 733*h*2 to connect the first and second rotation members 731 and 733. Because multiple first position adjustment holes 731*h*2 may be provided, it is possible in some embodiments of the inventive concept to adjust a position of the second rotation member 733 as connected to the first rotation member 731**.

Referring to FIG. 3, the insertion slot **733*h*1 may laterally extend (e.g., in the first direction D1) along the second rotation member 733. In this manner, the insertion slot 733*h*1 may receive one or both of the connection part 9 and the slurry distribution part 'B'. Thus, in some embodiments of the inventive concept, the support part 7** and the slurry distribution part 'B' may be connected in this manner.

And accordingly, the connection part 9 may be used to connect the support part 7 to the slurry distribution part 'B'. For example, the slurry distribution part 'B' may be connected through the connection part 9 to the support part 7 in order to laterally supported by the support part 7.

In some embodiments, the connection part 9 may include an upper coupling member 91, a lower coupling member 93, and a resilient member 95. The upper coupling member 91 may be inserted into the insertion slot **733*h*1. The connecting part (e.g., a bolt or screw) may be used to connect (or fix) the slurry distribution member B to the support part 7 when the upper coupling member 91 is inserted into the insertion slot 733*h*1. Here, a length of the upper coupling member 91 in the first direction D1 may be less than a length of the insertion slot 733*h*1 in the first direction D1. Accordingly, a connected position between the connection part 9 and the support part 7 may be varied in accordance with the position of the upper coupling member 91 in the insertion slot 733*h*1**. This variation in connected positioning may be used to finely adjust the positioning of the slurry distribution part 'B'.

Further in this regard, the lower coupling member 93 may be connected (or combined) with the slurry distribution part 'B'. For example, the lower coupling member 93 may be connected with the guide bar 3. That is, the connecting part (e.g., a bolt or a screw) may be inserted into a coupling hole formed in a top surface of the guide bar 3, thereby connecting the lower coupling member 93 to the guide bar 3. Two or more lower coupling members 93 may be provided, and spaced apart from each other in the first direction D1.

Thus, in relation to the illustrated embodiments of FIGS. 1, 2 and 3 the lower coupling member 93 may be combined with the guide bar 3, but the scope of the inventive concept are not limited thereto. For example, the lower coupling member 93 may be combined with one or both of the distribution bar 1 and the slurry delivery member 5.

The resilient member 95 may connect the upper coupling member 91 to the lower coupling member 93. Here, the resilient member 95 may include an elastic (or rigidly flexible) material, such as a metal plate. In this manner, it may be possible to relieve or suppress the propagation of vibrations and/or mechanical impact between the support part 7 and the slurry distribution part 'B'.

Figure 4:
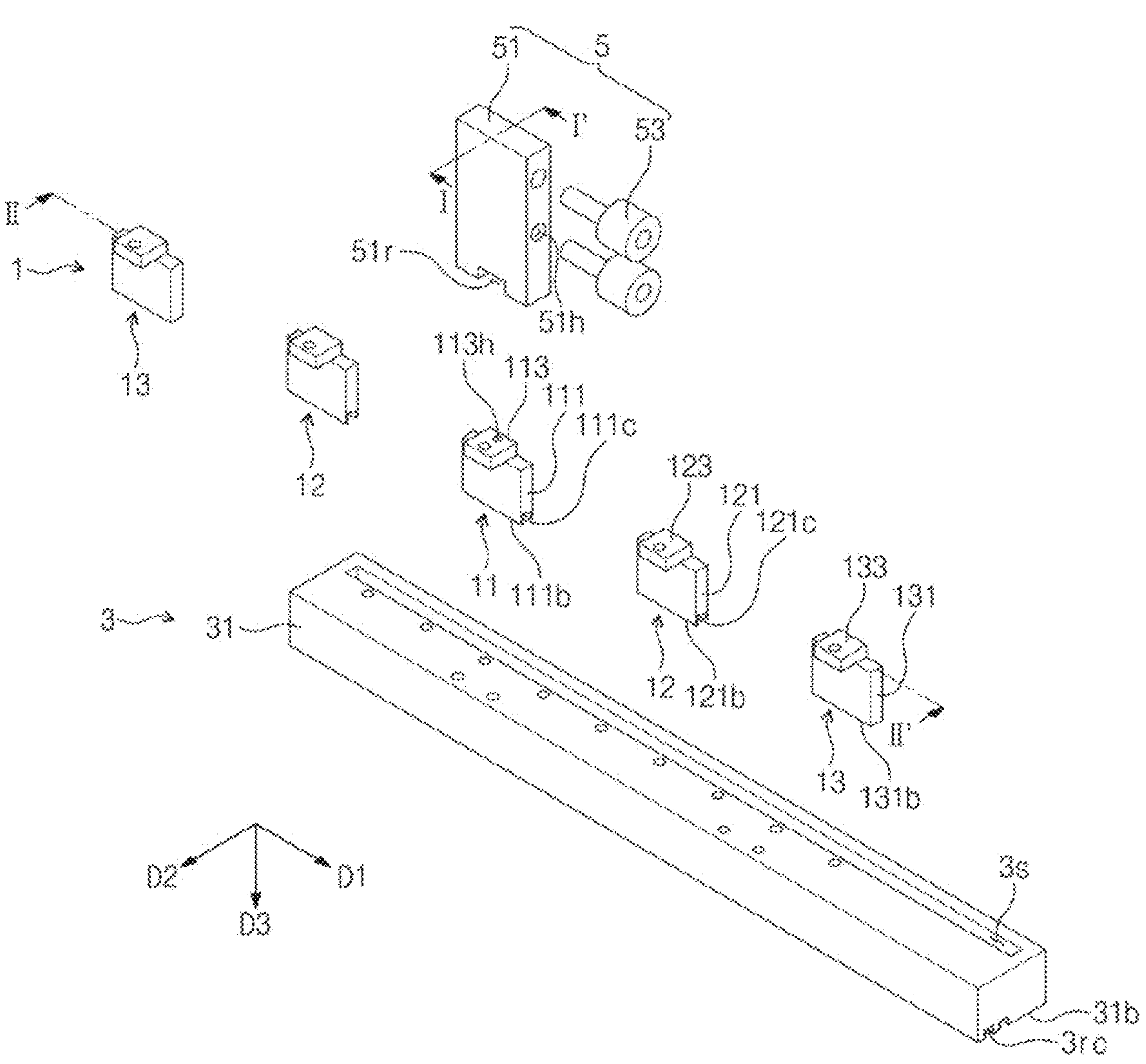
FIG. 4 is an exploded perspective view further illustrating a slurry distribution part of the slurry supply device 'D'.
Figure 5:
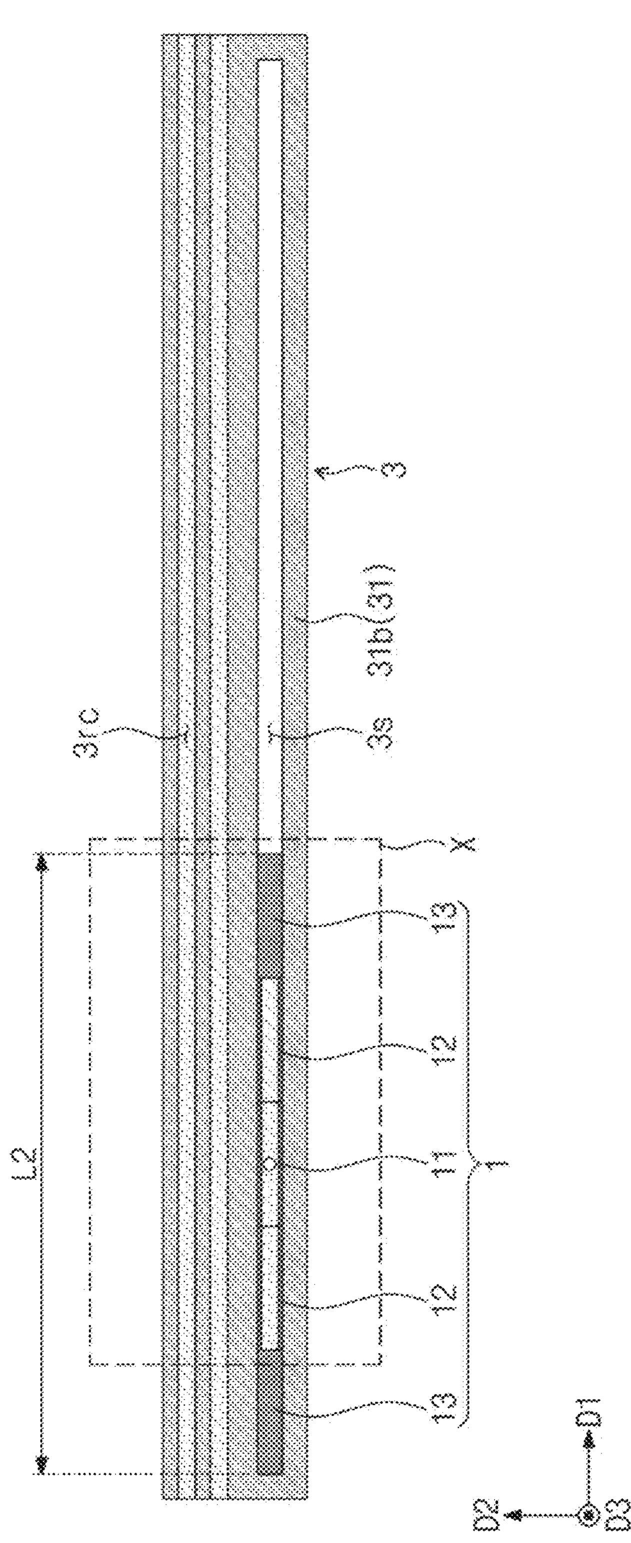
FIG. 5 is a bottom-up view further illustrating a slurry distribution part of the slurry supply device 'D'.
Figure 6:
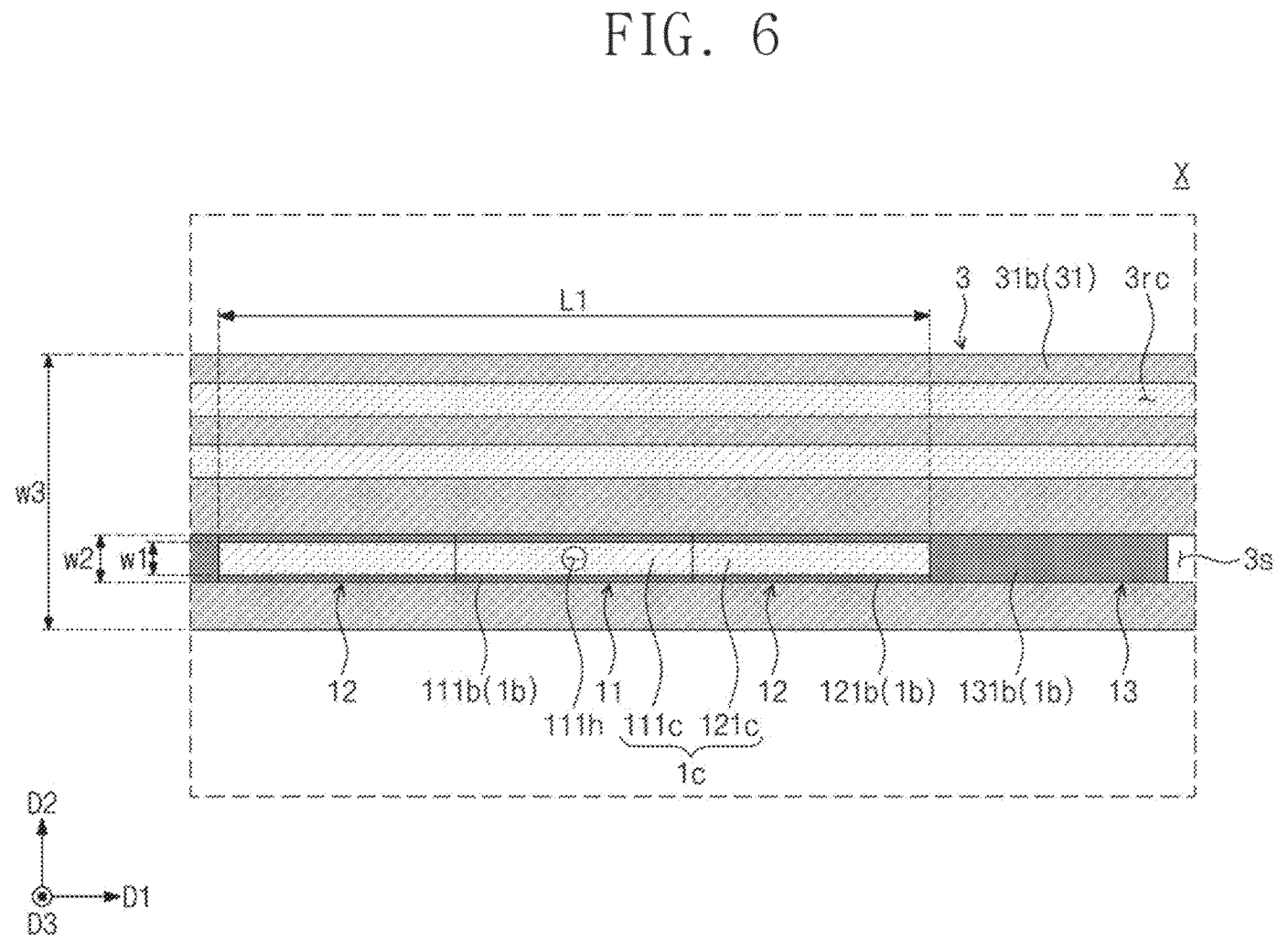

FIG. 4 is an exploded perspective view illustrating a slurry distribution part (analogous to the slurry distribution part B of FIGS. 1, 2 and 3) according to embodiments of the inventive concept. FIG. 5 is a bottom-up view further illustrating the slurry distribution part of FIG. 4, and FIG. 6 is a cross-sectional view further illustrating region 'X' indicated in FIG. 5.

Referring to FIGS. 1, 2, 3, 4, 5 and 6 (hereafter collectively, "FIGS. 1 to 6"), the guide bar 3 may include a guide body 31 and a laterally extending (e.g., in the first direction D1) slot **3*s*. Here, the slot 3*s* may vertically formed in a guide body 31. At least a portion of the distribution bar 1 may be inserted into the slot 3*s*. For example, the distribution bar 1 may be inserted into the slot 3*s* such that a bottom surface 1*b* of the distribution bar 1 is exposed through the slot 3*s* to downside space of the guide bar 3. With the distribution bar 1 inserted into the slot 3*s*, a bottom surface 31*b* of the guide body 31 may be disposed at substantially the same level as the bottom surface 1*b* of the distribution bar 1. (In this regard, the term "level" is used to denote a vertical disposition (e.g., measured in the third direction D3) relative to an arbitrarily selected horizontal surface). Alternately, however, the bottom surface 31***b* of the guide body 31 may be disposed at a different level than that of the bottom surface 1*b* of the distribution bar 1.

The guide bar 3 may further include a recovery channel 3*rc*. The recovery channel 3*rc* may be recessed upwardly by a certain depth in the bottom surface 31*b* of the guide body 31. However, in contrast to the slot 3*s*, the recovery channel 3*rc* does not fully penetrate the guide body 31. The recovery channel 3*rc* may laterally extend (e.g., in the first direction D1). For example, a length of the recovery channel 3*rc* in the first direction D1 may be substantially the same as a length of the guide body 31 in the first direction D1. In this regard, the recovery channel 3*rc* may be exposed in a surface of the guide body 31. The recovery channel 3*rc* may be spaced apart from the slot 3*s* in the second direction D2. In some embodiments, two or more recovery channels 3*rc* may be provided. (See, e.g., FIG. 5). In such embodiments, the two or more recovery channels 3*rc* may be spaced apart in the second direction D2. However, the following description largely assumes the use of a single recovery channel 3*rc*.

Referring to FIGS. 1 to 6, the distribution bar 1 may include a distribution channel 1*c* formed as a recess to a certain depth extending upwardly from the bottom surface 1*b* of the distribution bar 1. Here, the distribution channel 1*c* may not vertically penetrate the distribution bar 1.

Comparing FIGS. 5 and 6, the distribution channel 1*c* of the distribution bar 1 may include first length L1 and a second length L2, wherein the first length L1 in the first direction D1 is less than the second length L2 in the first direction D1. The distribution channel 1*c* may have a first width w1 in the second direction D2, and the distribution bar 1 may have a second width w2 in the second direction D2 measured in relation to the bottom surface 1*b* of the distribution bar 1, wherein the first width w1 is less than the second width w2.

For example, in some embodiments, the first width w1 may range from about 2 mm to about 6 mm, and the first width w1 may be about 4 mm. Alternately, the second width w2 may range from about 5 mm to about 9 mm, and the second width w2 may be about 7 mm. Because the first width w1 is less than the second width w2, the bottom surface 1*b* of the distribution bar 1 may be disposed in the second direction D2 (or in an opposite direction from the distribution channel 1*c*). Each of the first and second widths w1 and w2 may be less than the third width w3. The first width W1 may be less than the first length L1. Therefore, assuming that the distribution channel 1*c* has a tetragonal shape, the distribution channel 1*c* may have a rectangular shape extending in the first direction D1.

The distribution bar 1 may further include a supply passage 111*h*. The supply passage 111*h* may be connected to the distribution channel 1*c*. For example, the supply passage 111*h* may vertically extend to connect with the distribution channel 1*c* and vertically penetrate the distribution bar 1. The supply passage 111*h* may extend upwardly from the distribution channel 1*c* to be connected to an upside space of the distribution bar 1. The supply passage 111*h* may be connected to the slurry delivery member 5. Therefore, the slurry may transfer from the slurry delivery member 5 through the supply passage 111*h* to the distribution channel 1*c*. A length in the first direction D1 of the supply passage 111*h* may be less than the first length L1. A width in the second direction D2 of the supply passage 111*h* may be the same as or less than the first width w1. For example, the supply passage 111*h* may have a circular shape. Thus, in the foregoing example, the supply passage 111*h* may vertically extend to connect with the slurry delivery member 5, but the inventive concept are not limited thereto. For example, the supply passage 111*h* may laterally extend from the distribution channel 1*c* to connect to the slurry delivery member 5.

Referring to FIGS. 1 to 6, the distribution bar 1 may include multiple blocks (e.g., a first block 11, a second block 12, and a third block 13).

The first block 11 may include a first block body 111 and a first connection block 113. The first block body 111 may be inserted into the slot 3*s*. The first block body 111 may provide a first distribution channel 111*c*. The first distribution channel 111*c* may be formed recessed upwardly from a bottom surface 111*b* of the first block 11. The first distribution channel 111*c* may be a portion of the distribution channel 1*c* discussed with reference to FIG. 6. The supply passage 111*h* of FIG. 6 may be formed on the first distribution channel 111*c*. For example, the supply passage 111*h* may vertically penetrate the first block body 111 to connect with the first distribution channel 111*c*. The first connection block 113 may be coupled onto the first block body 111. The first block 11 may be combined with the guide bar 3 through the first connection block 113. For example, the guide bar 3 may be fixed with a coupling means (not shown) such as a bolt that penetrates the first connection block 113, and thus the first block 11 may be fixedly combined with the guide bar 3. The first connection block 113 may provide an extension passage 113*h*. The extension passage 113*h* may vertically penetrate the first connection block 113. The extension passage 113*h* may be connected to the supply passage 111*h*. The first block 11 may be combined with the slurry delivery member 5. A length in the first direction D1 of the first block 11 may be about 20 mm, but the inventive concept are not limited thereto.

The second block 12 may include a second block body 121 and a second connection block 123. The second block body 121 may be inserted into the slot 3*s*. The second block body 121 may provide a second distribution channel 121*c*. The second distribution channel 121*c* may be formed recessed upwardly from a bottom surface 121*b* of the second block 12. The second distribution channel 121*c* may be a portion of the distribution channel 1*c* of FIG. 6. The second distribution channel 121*c* may be connected to the first distribution channel 111*c*. For example, the first distribution channel 111*c* and the second distribution channel 121*c* may be connected to form the distribution channel 1*c*. In addition, the bottom surface 121*b* of the second block 12 and the bottom surface 111*b* of the first block 11 may be connected to form the bottom surface 1*b* of the distribution bar 1 of FIG. 6. The second connection block 123 may be coupled onto the second block body 121. The second block 12 may be combined with the guide bar 3 through the second connection block 123. For example, the guide bar 3 may be fixed with a connecting part (e.g., a bolt or screw) that penetrates the second connection block 123. Thus, the second block 12 may be fixedly combined with the guide bar 3. The second block 12 may be positioned on a lateral surface of the first block 11. In this configuration, the second block 12 and the first block 11 may be horizontally connected to each other. In some embodiments, the second block 12 may be provided in plural. For example, as shown in FIGS. 4, 5 and 6, two second blocks 12 may be provided. The two second blocks 12 may stand opposite to each other across the first block 11. The inventive concept, however, are not limited thereto, and the number of the second block 12 may be variously changed as needed. The length of the distribution channel 1*c* may be adjusted depending on the number of the second block 12. For example, an increase in the number of the second block 12 may induce an increase in the length in the first direction D1 of the distribution channel 1*c*. In contrast, a reduction in the number of the second block 12 may induce a reduction in the length in the first direction D1 of the distribution channel 1*c*. For convenience, the following will describe a single second block 12. A length in the first direction D1 of the second block 12 may be about 20 mm, but the inventive concept are not limited thereto.

The third block 13 may include a third block body 131 and a third connection block 133. The third block body 131 may be inserted into the slot 3*s*. The third block body 131 may not provide a recessed structure. For example, the third block body 131 may provide no distribution channel. Therefore, the third block 13 may have a simple flat surface at a bottom surface 131*b* thereof. The bottom surface 131*b* of the third block 13, the bottom surface 111*b* of the first block 11, and the bottom surface 121*b* of the second block 12 may be connected to form the bottom surface 1*b* of the distribution bar 1 discussed with reference to FIG. 6. The third block body 131 may have a height substantially the same as or similar to that of the second block body 121. Therefore, the third block 13 may close one end of the distribution channel 1*c*. The third connection block 133 may be coupled onto the third block body 131. The third block 13 may be combined with the guide bar 3 through the third connection block 133. For example, the guide bar 3 may be fixed with a coupling means (not shown) such as a bolt that penetrates the third connection block 133, and thus the third block 13 may be fixedly combined with the guide bar 3. The third block 13 may be positioned on a lateral surface of the second block 12. For example, the third block 13 may be positioned at an outermost side of the distribution bar 1. In some embodiments, two third blocks 13 may be provided. As shown in FIGS. 4, 5 and 6, the two third blocks 13 may stand opposite to each other. For convenience, the following will describe a single third block 13. A length in the first direction D1 of the third block 13 may be about 20 mm, but the inventive concept are not limited thereto. The first block 11, the second block 12, and the third block 13 may be horizontally connected to each other.

The following description of embodiments assumes that only the first block 11 is provided with one supply passage 111*h*, but the inventive concept are not limited thereto. For example, multiple supply passages may be provided to connect the distribution channel 1*c* to the slurry delivery member 5, and the second block 12 may be provided with one or more of the supply passages.

Referring to FIGS. 2 and 4, the slurry delivery member 5 may include a delivery body 51 and a delivery port 53. The delivery body 51 may be connected to the distribution bar 1. For example, the delivery body 51 may be coupled onto the first block 11. That is, the delivery body 51 may be provided with a placement opening 51*r* into which the first connection block 113 is inserted, and thus the delivery body 51 may be combined with the distribution bar 1. The delivery port 53 may be connected to the delivery body 51. For example, the delivery port 53 may be inserted into a delivery passage 51*h* formed in the delivery body 51, thereby being combined with the delivery body 51. The delivery port 53 may be connected to the slurry tank 'SS'. The slurry may transfer from the slurry tank 'SS' to the distribution bar 1 through the delivery port 53 and the delivery body 51.

Figure 7:
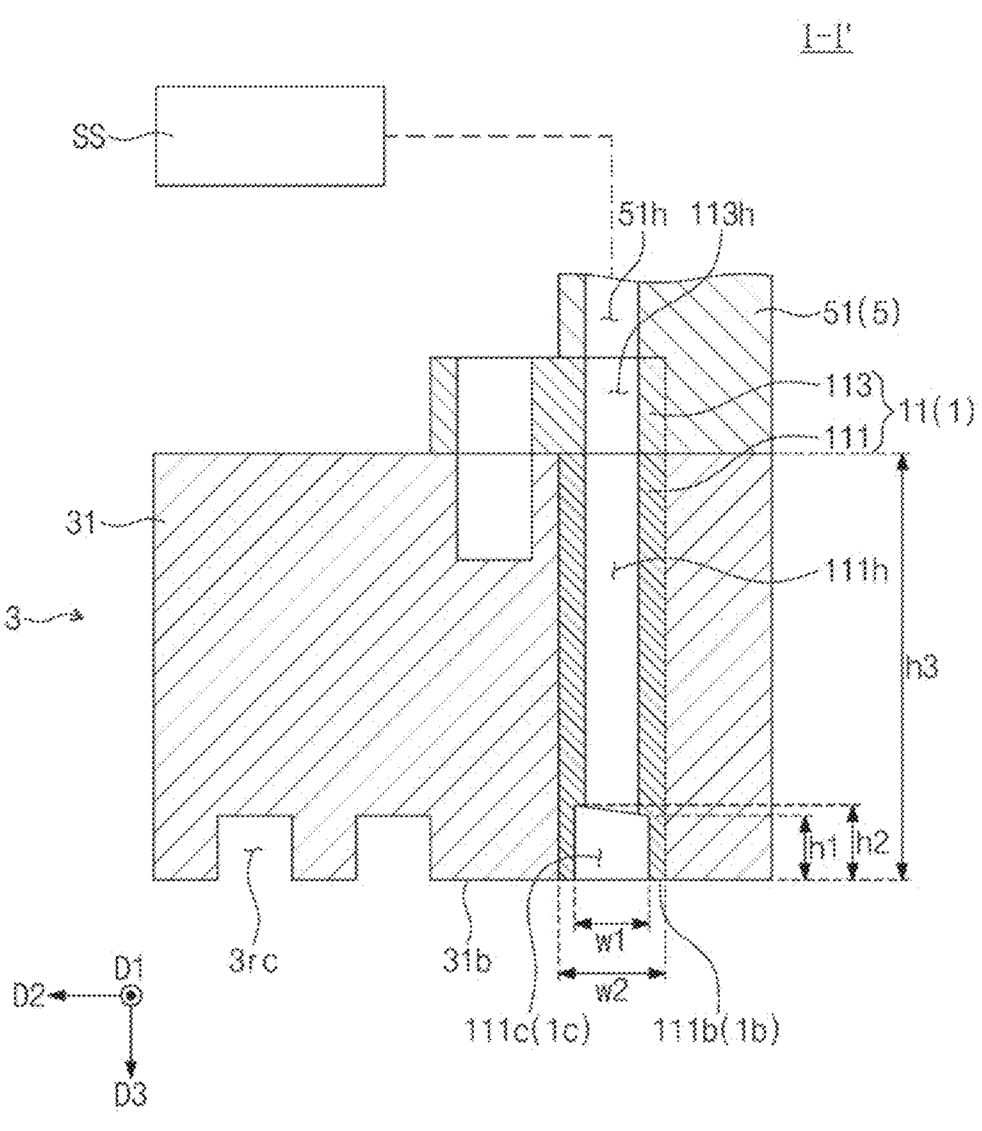
FIG. 7 is a cross-sectional view taken along line I-I' of FIG. 4.

FIG. 7 is a cross-sectional view taken along line I-I' of FIG. 4.

Referring to FIGS. 4 and 7, the delivery passage 51*h*, the extension passage 113*h*, the supply passage 111*h*, and the distribution channel 1*c* may be connected to each other.

A depth in the third direction D3 of the distribution channel 1*c* may range from about 0.5 mm to about 1.2 mm. For example, the depth of the distribution channel 1*c* may range from about 0.8 mm to about 0.9 mm. As the distribution channel 1*c* does not vertically penetrate the distribution bar 1, the depth of the distribution channel 1*c* may be less than a third depth h3 or a depth of the first block body 111. In some embodiments, the depth of the distribution channel 1*c* may be changed based on position. For example, the depth of the distribution channel 1*c* may become greater in the second direction D2. That is, the depth of the distribution channel 1*c* may range from a first depth h1 to a second depth h2 that is greater in the second direction D2 than the first depth h1. The first depth h1 may be about 0.8 mm. The second depth h2 may be about 0.9 mm. The depth of the distribution channel 1*c* may linearly increase in the second direction D2, but the inventive concept are not limited thereto.

Figure 8:
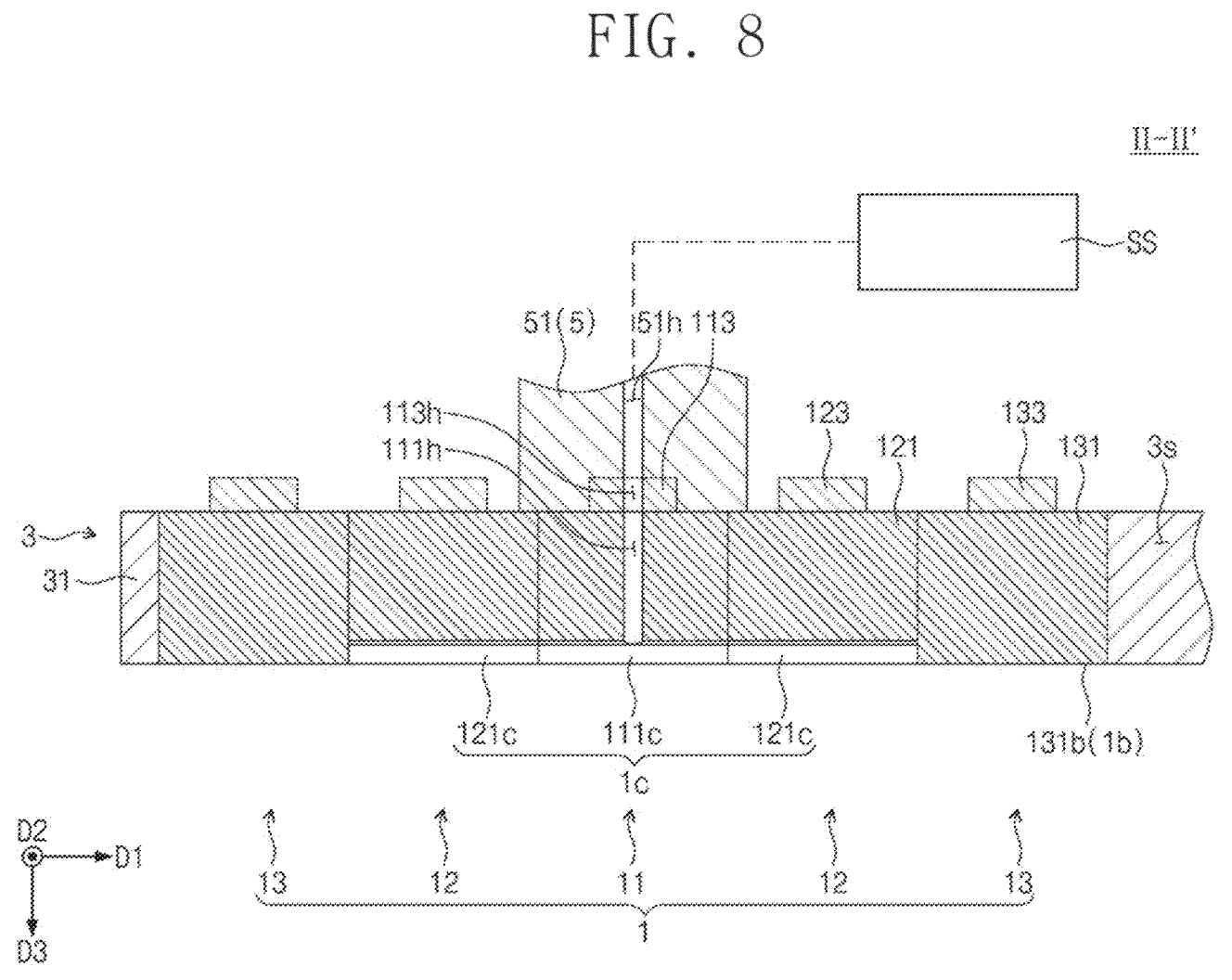

FIG. 8 is a cross-sectional view taken along line II-II' of FIG. 4.

Referring to FIGS. 4 and 8, the delivery passage 51*h*, the extension passage 113*h*, the supply passage 111*h*, and the distribution channel 1*c* may be connected to each other. In addition, the first distribution channel 111*c* and two second distribution channels 121*c* may be connected to form one distribution channel 1*c*. As discussed above, the distribution channel 1*c* may be a space that is upwardly recessed to a certain depth from the bottom surface 1*b* of the distribution bar 1. The slurry supplied from the slurry tank 'SS' may transfer through the delivery passage 51*h*, the extension passage 113*h*, and the supply passage 111*h*, and then may be dispersed in the first direction D1 in the distribution channel 1*c*.

Figure 9:
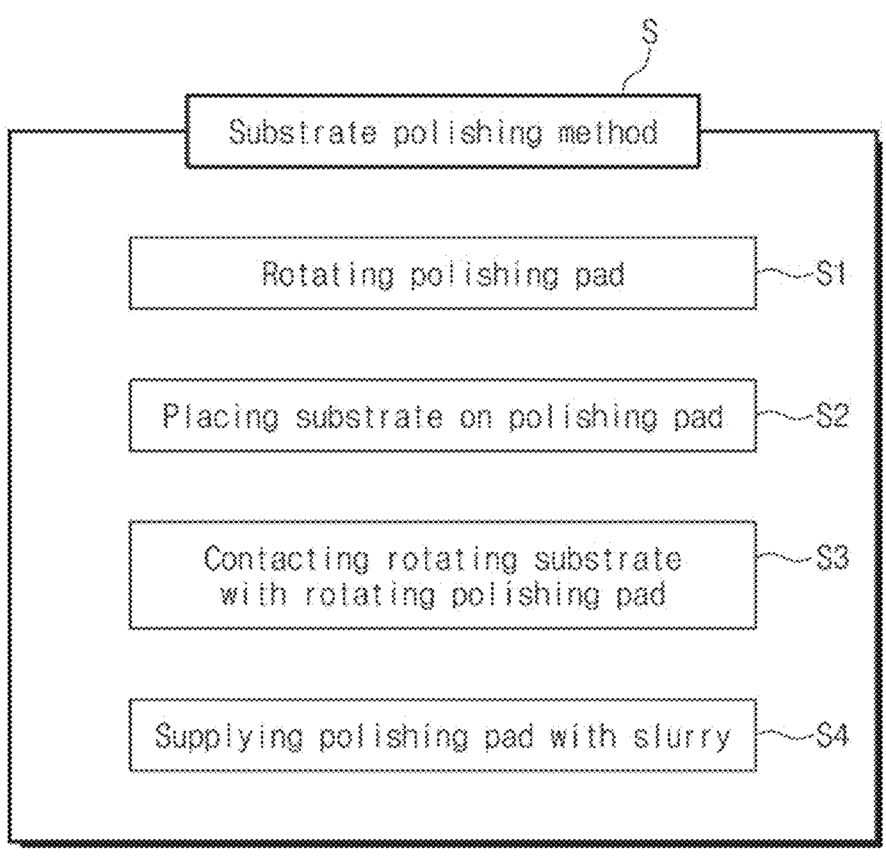
FIG. 9 is a flow chart illustrating a substrate polishing method according to embodiments of the inventive concept.

FIG. 9 is a flow chart illustrating a substrate polishing method 'S' according to embodiments of the inventive concept.

Referring to FIG. 9, the substrate polishing method 'S' may be used within the context of the foregoing embodiments (e.g., FIGS. 1 to 6, 7, and 8) to polish a substrate using, for example, the substrate polishing apparatus 'A' of FIG. 1. The substrate polishing method 'S' may generally include: rotating a polishing pad 'PP' (S1), placing the substrate on the polishing pad 'PP' (S2); contacting the rotating substrate with the polishing pad 'PP" (S3); and supplying the polishing pad 'PP' with slurry (S4).

Figure 10:
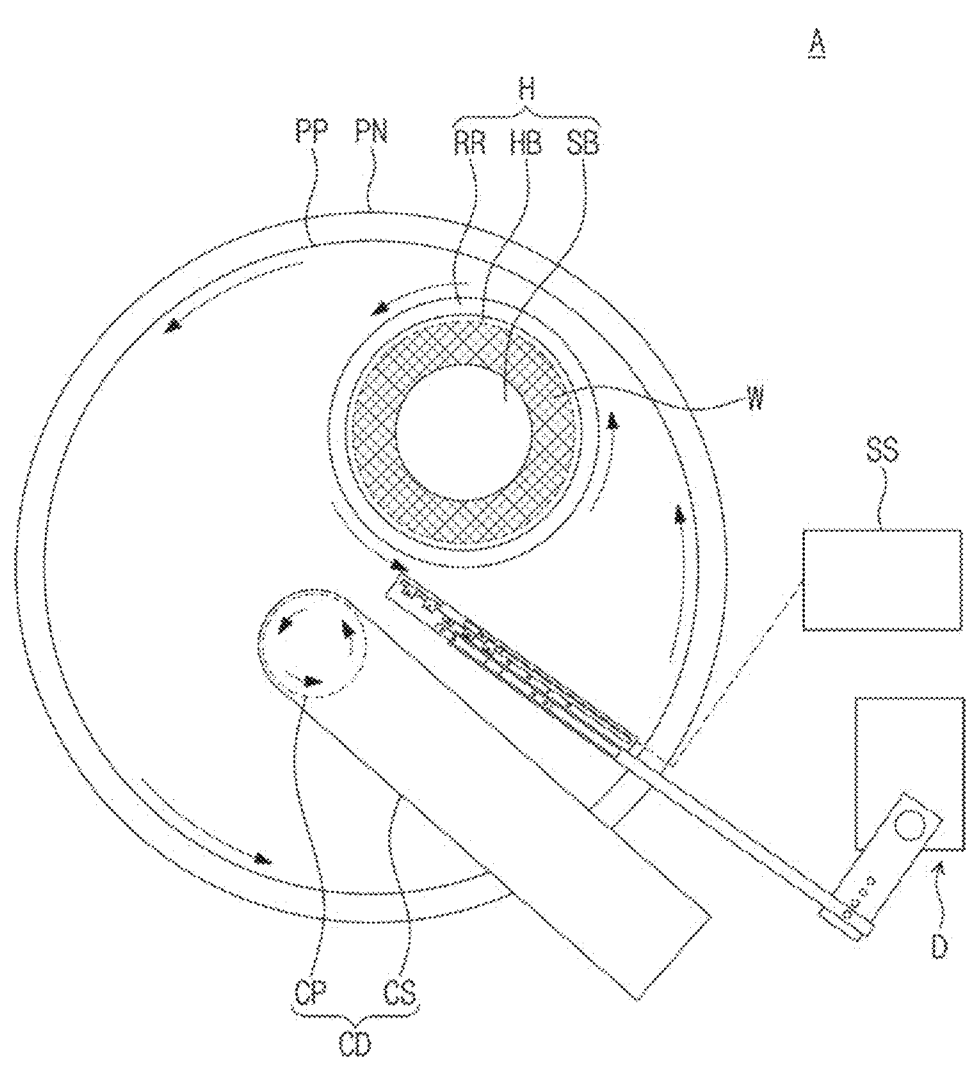
Figure 11:
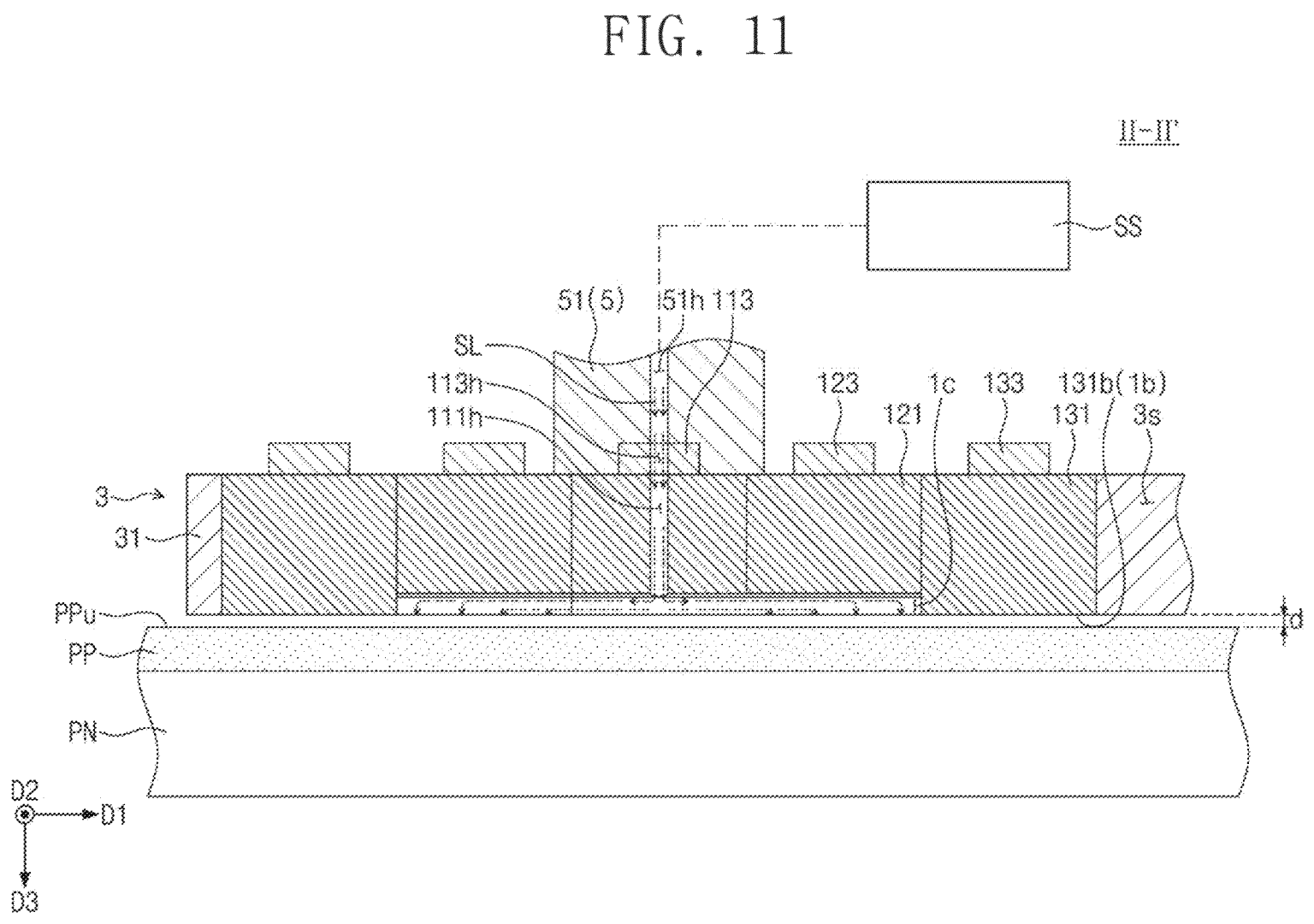
Figure 12:
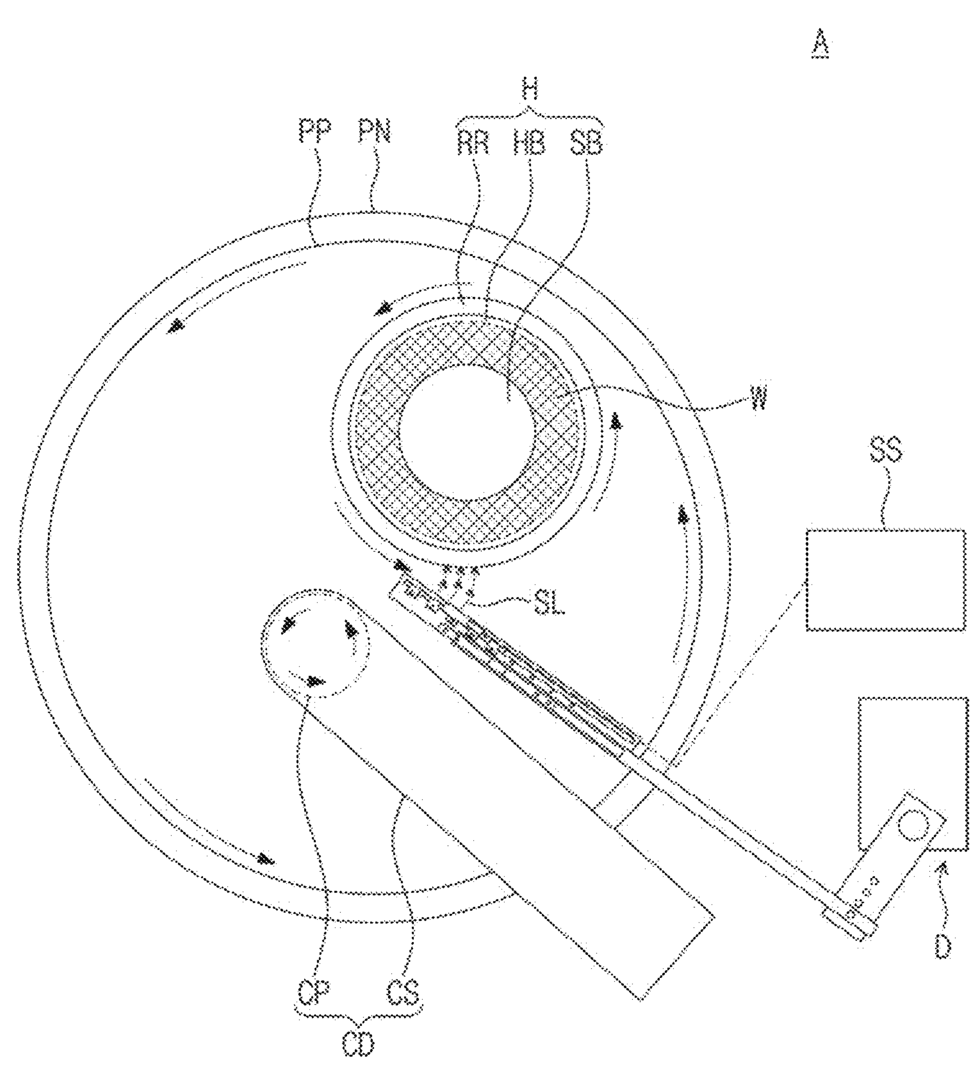

With reference to FIGS. 10, 11 and 12, the substrate polishing method 'S' of FIG. 9 will be described in some additional detail.

Thus, referring to FIGS. 9 and 10, the polishing pad rotation (step S1) may include using the platen 'PN' to rotate the polishing pad 'PP'. The polishing pad 'PP' shaped like a disk may rotate around a center of the disk. For example, as shown in FIG. 10, the polishing pad 'PP' may rotate in a counterclockwise direction.

The substrate placement (step S2) may include using the polishing head 'H' to place a substrate 'W' on the polishing pad 'PP'. For example, in a state where the substrate 'W' is adhered on a bottom surface of the head body 'HB', the head supporter 'SB' may allow the substrate 'W' to move onto the polishing pad 'PP' during its rotation.

The substrate contact (step S3) may include contacting the substrate 'W' with a top surface of the polishing pad 'PP' while the polishing pad rotates. Therefore, the top surface of the polishing pad 'PP' may polish a bottom surface of the substrate 'W'. At this time, a bottom surface of the conditioning disk 'CP' of the conditioning device 'CD' may abrade the polishing pad 'PP', while contacting the top surface of the polishing pad 'PP'.

Referring to FIGS. 9, 11, and 12, the supplying of supply (step S4) may include transferring slurry 'SL' to the slurry supply device 'D' as received from the slurry tank 'SS' and dispensing the slurry 'SL' onto the polishing pad 'PP'. During this method step, the bottom surface 1*b* of the distribution bar 1 may be upwardly spaced apart from a top surface 'PPu' of the polishing pad 'PP'. In addition, the bottom surface 1*b* of the distribution bar 1 may face (or be directed towards) the top surface 'PPu' of the polishing pad 'PP'. There may be a small interval 'D' between the bottom surface 1*b* of the distribution bar 1 and the top surface 'PPu' of the polishing pad 'PP'. For example, a several micrometers may be given to the interval 'D' between the bottom surface 1*b* of the distribution bar 1 and the top surface 'PPu' of the polishing pad 'PP'.

The slurry SL may transfer from the slurry tank 'SS' to the distribution channel 1*c* through the slurry delivery member 5 and the supply passage 111*h*. The slurry 'SL' may be dispensed in the first direction D1 along the distribution channel 1*c*. For example, because there is a small interval between the bottom surface 1*b* of the distribution bar 1 and the top surface 'PPu' of the polishing pad 'PP', the slurry SL introduced into the distribution channel 1*c* may temporarily stay in the distribution channel 1*c* without being directly dispensed (or sprayed outwardly) from the distribution bar 1. Accordingly, at this time, the slurry SL may be dispensed the first direction D1 along the distribution channel 1*c*. Afterwards, the slurry SL—having been initially dispensed in the first direction D1 and immediately thereafter spread out—may be sprayed outwardly from the distribution bar 1 through a space between the bottom surface 1*b* of the distribution bar 1 and the top surface 'PPu' of the polishing pad 'PP'. For example, the slurry SL may pass through between the bottom surface 1*b* of the distribution bar 1 and the top surface 'PPu' of the polishing pad 'PP'. The slurry SL may dispense towards the substrate W adhered on a bottom surface of the polishing head 'H' while rotating along the top surface 'PPu' of the polishing pad 'PP'. The substrate W may be provided on its bottom surface with the slurry SL as initially dispersed in the first direction D1 along the distribution channel 1*c*.

When the polishing pad 'PP' rotates at higher speeds, the slurry SL may be more evenly and readily dispensed (e.g., prayed outwardly) from the distribution channel 1*c*. Therefore, the interval between the bottom surface 1*b* of the distribution bar 1 and the top surface 'PPu' of the polishing pad 'PP' may be appropriately adjusted in relation to the rotational speed of the polishing pad 'PP'. For example, an increase in rotation speed of the polishing pad 'PP' may reduce the interval between the bottom surface 1*b* of the redistribution bar 1 and the top surface 'PPu' of the polishing pad 'PP', whereas a reduction in rotational speed of the polishing pad 'PP' may increase the interval between the bottom surface 1*b* of the redistribution bar 1 and the top surface 'PPu' of the polishing pad 'PP'. In this manner, it is possible to more appropriately, economically and efficiently dispense slurry SL in a substrate polishing apparatus.

Slurry supply devices, slurry substrate polishing apparatuses, and substrate polishing methods according to embodiments of the inventive concept are better able to widely dispense slurry in relation to a polishing pad and substrate being polished. That is, embodiments of the inventive concept may dispense a relatively thin, uniform and broadly dispersed flow of slurry to the surface of a polishing pad, wherein this type of slurry flow is markedly less likely to impact or collided with the retainer ring associated with a polishing head. Therefore, it may be possible to reduce an amount of wasted slurry that fails to contact the substrate, and this outcome decreases the overall cost of substrate polishing.

Slurry supply devices, slurry substrate polishing apparatuses, and substrate polishing methods according to embodiments of the inventive concept may include a distribution bar including multiple blocks and/or multiple distribution channels. Such configurations allow the length of the distribution channel to be adjusted by controlling the number of the blocks. Therefore, as needed, a supply area for the slurry may be adjusted to appropriately control a degree of dispersion for the slurry in relation to the polishing pad and substrate being polished.

Slurry supply devices, slurry substrate polishing apparatuses, and substrate polishing methods according to embodiments of the inventive concept provide an improved distribution bar that may be inserted into and combined with a slot. Hence, a connection between a slurry distribution part and a support part may be achieved as the result of the connection between a guide bar and the support part. Thus, under circumstances wherein a number of blocks included in the distribution bar is changed, there will be no materially adverse effect on the connection between the slurry distribution part and the support part. Additionally or alternately, a variable numbers of blocks may be inserted into a relatively long slot in order to readily adjust the slurry supply area. Moreover, a recovery channel associated with the guide bar may collect and outwardly discharge slurry and other material(s) generated by the action of the polishing pad. In this manner, polishing residue and other potential contaminants may be removed from the polishing pad, thereby improving the efficiency and effectiveness of the polishing process.

Slurry supply devices, slurry substrate polishing apparatuses, and substrate polishing methods according to the inventive concept more regularly supply slurry to the polishing pad, more thinly dispense slurry onto the polishing pad, and better control a slurry supply area. And as a result, slurry supply devices, slurry substrate polishing apparatuses, and substrate polishing methods consistent with embodiments of the inventive concept reduce wasted slurry and reduce costs associated with substrate polishing.

However, the benefits, advantages and improved performance results provided by embodiments of the inventive concept are not limited to only the foregoing.

Although the inventive concept have been described in relation to certain illustrated embodiments, those skilled in the art will recognize that various changes and modifications may be made without departing from the scope of the inventive concept, as defied by the following claims. Therefore, those skilled in the art will understand that the foregoing embodiments are presented as illustrative or teaching examples.

What is claimed is:

1. A slurry supply device, comprising:

a slurry distribution part configured to dispense slurry; and a support part connected to the slurry distribution part and configured to support the slurry distribution part, wherein the slurry distribution part includes:

a guide bar including a slot extending in a first direction;

a distribution bar inserted into the slot and including a distribution channel extending in the first direction, the distribution channel being recessed upwardly from a bottom surface of the distribution bar; and a slurry delivery member configured to deliver the slurry to the distribution channel, wherein the distribution bar further includes a supply passage inside the distribution bar, the supply passage extending upwardly from the distribution channel and connecting to the slurry delivery member, wherein the distribution bar further includes a first distribution block and a second distribution block, the first distribution block and the second distribution block are horizontally connected and inserted into the slot, the first distribution block includes a first distribution channel recessed upwardly from a first bottom surface of the first distribution block, the second distribution block includes a second distribution channel recessed upwardly from a second bottom surface of the second distribution block, the first bottom surface and the second bottom surface are connected to form the bottom surface of the distribution bar, the first distribution channel and the second distribution channel are connected to form the distribution channel, and the supply passage is disposed in the first distribution block.

2. The slurry supply device of claim 1, wherein a length of the distribution channel in the first direction is greater than a length of the supply passage in the first direction.

3. The slurry supply device of claim 1, wherein the distribution bar further includes a third distribution block, the third distribution block is horizontally connected to the second distribution block and inserted into the slot, and a third bottom surface of the third distribution block is connected to the second bottom surface.

4. The slurry supply device of claim 1, wherein a length of the distribution channel in the first direction is less than a length the distribution bar in the first direction.

5. The slurry supply device of claim 1, wherein a depth of the distribution channel increases in a second direction intersecting the first direction.

6. The slurry supply device of claim 1, wherein a depth of the distribution channel ranges from about 0.5 mm to about 1.2 mm.

7. The slurry supply device of claim 1, further comprising:

a connection part configured to connect the slurry distribution part to the support part, wherein the connection part includes an upper coupling member connected to the support part, a lower coupling member connected to the slurry distribution part, and a resilient member connecting the upper coupling member to the lower coupling member.

8. The slurry supply device of claim 1, wherein the guide bar further includes a recovery channel recessed upwardly from a bottom surface of the guide bar and spaced apart from the slot in a second direction intersecting the first direction.

9. The slurry supply device of claim 8, wherein a length of the recovery channel in the first direction is a same as a length of the guide bar in the first direction.

10. A substrate polishing apparatus, comprising:

a platen configured to support a polishing pad;

a polishing head on the platen; and a slurry supply device separated from the polishing head, wherein the slurry supply device includes:

a slurry distribution part configured to dispense slurry and including a distribution bar extending in a first direction and including a distribution channel recessed upwardly from a bottom surface of the distribution bar and a slurry delivery member configured to deliver the slurry to the distribution channel, wherein the distribution bar further includes a supply passage inside the distribution bar, the supply passage extending upwardly from the distribution channel and connecting to the slurry delivery member, wherein the slurry distribution part further includes a guide bar including a slot extending in the first direction and vertically penetrating the guide bar, and a support part connected to the slurry distribution part and configured to support the slurry distribution part, wherein a width of the distribution channel in a second direction is less than a width of the bottom surface of the distribution bar in the second direction, and the second direction intersects the first direction, wherein the distribution bar further includes a first distribution block and a second distribution block, the first distribution block and the second distribution block are horizontally connected and inserted into the slot, the first distribution block includes a first distribution channel recessed upwardly from a first bottom surface of the first distribution block, the second distribution block includes a second distribution channel recessed upwardly from a second bottom surface of the second distribution block, the first bottom surface and the second bottom surface are connected to form the bottom surface of the distribution bar, the first distribution channel and the second distribution channel are connected to form the distribution channel, and the supply passage is disposed in the first distribution block.

11. The apparatus of claim 10, further comprising a conditioning device, wherein the distribution bar is disposed between the conditioning device and the polishing head.

12. The apparatus of claim 10, wherein the support part includes a rotation support shaft and a rotation member rotationally coupled to the rotation support shaft, and the slurry distribution part is connected to the rotation member.

13. The apparatus of claim 12, wherein the slurry supply device further includes a connection part configured to connect the slurry distribution part to the support part, the rotation member includes a first rotation member rotationally coupled to the rotation support shaft and a second rotation member connected to the first rotation member, the second rotation member includes an insertion slot extending in the first direction, and the connection part is inserted into the insertion slot to connect the second rotation member.

14. A substrate polishing method, comprising:

rotating a polishing pad;

placing a substrate on the polishing pad;

contacting the substrate with the polishing pad; and supplying the polishing pad with slurry using a slurry distribution part of a slurry supply device to dispense the slurry onto a surface of the polishing pad, wherein the slurry distribution part includes a distribution bar including a distribution channel extending in a first direction, and a slurry delivery member configured to deliver the slurry to the distribution bar, wherein the slurry distribution part further includes a guide bar including a slot extending in the first direction and vertically penetrating the guide bar, the distribution bar further includes a supply passage inside the distribution bar, the supply passage extending upwardly from the distribution channel and connecting to the slurry delivery member, the distribution bar further includes first distribution block and a second distribution block, the first distribution block and the second distribution block are horizontally connected and inserted into the slot, the first distribution block includes a first distribution channel recessed upwardly from a first bottom surface of the first distribution block, the second distribution block includes a second distribution channel recessed upwardly from a second bottom surface of the second distribution block, the first bottom surface and the second bottom surface are connected to form a bottom surface of the distribution bar, the first distribution channel and the second distribution channel are connected to form the distribution channel, and the supply passage is disposed in the first distribution block, the distribution channel is recessed upwardly from the bottom surface of the distribution bar, and the bottom surface of the distribution bar faces a top surface of the polishing pad.

15. The method of claim 14, wherein the supplying of the polishing pad with the slurry includes:

transferring the slurry from a slurry tank to the slurry delivery member;

transferring the slurry from the slurry delivery member to the distribution channel; and dispensing the slurry in the first direction along the distribution channel.

16. The method of claim 15, wherein the supplying of the polishing pad with the slurry further includes transferring the slurry between the bottom surface of the distribution bar and the top surface of the polishing pad.

17. The method of claim 15, wherein the supplying of the polishing pad with the slurry further includes transferring the slurry towards the distribution channel through the supply passage.

* * * * *